(12) United States Patent
Sarpeshkar

(10) Patent No.: US 6,262,678 B1
(45) Date of Patent: Jul. 17, 2001

(54) CURRENT-MODE SPIKE-BASED ANALOG-TO-DIGITAL CONVERSION

(75) Inventor: Rahul Sarpeshkar, Cambridge, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/408,379

(22) Filed: Sep. 29, 1999

(51) Int. Cl.[7] ................................................. H03M 1/00
(52) U.S. Cl. .................... 341/155; 341/155; 341/161; 341/156; 341/162; 341/110; 341/170; 341/126; 341/139; 395/2; 395/2.1; 395/2.14; 395/2.36
(58) Field of Search ....................... 341/155, 110, 341/120, 126, 139, 156, 161

(56) References Cited

U.S. PATENT DOCUMENTS

| | | |
|---|---|---|
| 3,582,628 | 6/1971 | Brussolo . |
| 3,909,597 | * 9/1975 | Dunn et al. .......................... 235/150 |
| 5,041,831 | * 8/1991 | Bohley et al. ....................... 341/144 |
| 5,107,146 | 4/1992 | El-Ayat . |
| 5,274,377 | 12/1993 | Matsuura et al. . |
| 5,543,795 | * 8/1996 | Fernald ............................... 341/163 |
| 5,583,503 | * 12/1996 | Kusakabe ............................ 341/161 |

OTHER PUBLICATIONS

R. Sarpeshkar, "Analog Versus Digital: Extrapolating from Electronics to Neurobiology," Neural Computation, 10, 1601–1638 (1998).

* cited by examiner

Primary Examiner—Michael Tokar
Assistant Examiner—Lam T. Mai
(74) Attorney, Agent, or Firm—William Ryan

(57) ABSTRACT

A/D conversion of a current input is performed with integrate-and-fire spiking neurons. Techniques that upcount or downcount the number of spikes fired by one neuron in a time period established by another neuron yield quantized estimates of analog charge residues created by the input current. Recursive application of alternate upcounting and downcounting operations yields successively finer quantization estimates that are terminated by an error-correction operation to obtain the least significant bit of the conversion. A spike-based hybrid state machine (HSM) employing both analog and digital elements is configured to create a 2-step or a successive-subranging analog-to-digital converter. The speed of the conversion is augmented in a pipelined topology. In the HSM, a spike-triggered finite state machine (FSM) controls the input currents to the spiking neurons and is in turn controlled by spikes arising from these neurons. A realization of a 2-step overrange-subrange A/D converter provides an exemplary illustration of the successful use of these techniques.

21 Claims, 10 Drawing Sheets

CURRENT-MODE SPIKE-BASED ANALOG-TO-DIGITAL CONVERSION

RELATED APPLICATIONS

Subject matter relating to that of the present application is presented in four U.S. Patent applications filed concurrently with this application: Spiking Neuron Circuit and Spike-Based Hybrid Computation, by R. Sarpeshkar; and A Spike-Triggered Asynchronous Finite State Machine, and An Edge-Triggered Toggle Flip-Flop Circuit, by R. Sarpeshkar and R. Herrera. These applications are assigned to the assignee of the present application and are hereby incorporated by reference in the present application.

FIELD OF THE INVENTION

The present invention relates generally to the field of electronic computers and computation. More particularly, the present invention relates, in one aspect, to hybrid analog and digital computation. Still more particularly, the present invention relates to spike-based analog-to-digital conversion using hybrid analog-digital techniques and organizations.

BACKGROUND OF THE INVENTION

Analog-to-digital conversion is used in a wide variety of electronics applications—from testing and measurement to entertainment electronics and beyond. In modern practice virtually any electronics application that involves real-word (analog) signals such as sounds, light and temperature employs treatment of corresponding signals in digital form for some part of its operation. Thus, for example, music compact discs store and make available for retrieval digital versions of what normally originate as analog voice or instrument signals. Upon retrieval, such stored signals typically return to their original analog form for playback.

Conversion of signals between the analog and digital domains is therefore a well-developed art. In a larger sense, analog-to-digital (A/D) conversion relates to the conversion of a continuous variable to a nearest discrete approximation, which approximation is generally represented as a multi-bit binary number. See, for example, P. Horowitz and W. Hill, *The Art of Electronics*, Cambridge Univ. Press, Cambridge, 1989, pp. 612–641.

Many prior analog-to-digital (A/D) converters employ voltage sample-and-hold techniques. These prior techniques thus employ a voltage signal sampled at an instant within a longer period, rather than using a signal averaged over the period. In such sampled operation, noise present at the time of sampling can significantly affect the value used in conversion.

Other structures characteristic of prior A/D architectures include subtractors or other comparator circuitry, or they include explicit D/A converters and other interstage circuitry, all of which tend to increase complexity, required device area and, consequently, cost. Moreover, when traditional architectures perform subranging without subtraction and inter-stage DACs they typically suffer from a requirement that the common-mode voltage range of fine conversion(s) must extend over the entire common-mode range of the coarse conversion(s), thereby degrading speed of operation.

Another phenomenon suffered by traditional architectures arises when comparator s, which are ubiquitous in A/D converters, hover indefinitely between their stable '0' or '1' states. Such metastability arises when input and reference voltages of the comparator are very near to each other, thus causing internal positive and negative currents in the comparator to be almost balanced; such near-perfect balance results in very slow operation of the comparator and causes digital decisions to be made on premature analog values.

In my incorporated patent application entitled Spike-Based Hybrid Computation I describe, inter alia, a comprehensive structure, organization and methodology for a novel hybrid state machine that includes both analog and digital structures. Such computational structures convieniently employ spiking neuron circuits modeled generally on neuron functioning in animals. Illustrative circuits described in this incorporated patent application include so-called neuron circuits for accumulating analog current signals over a period of time and the generation of fast-rising spiking signals as output. Moreover, many traditional analog and digital circuits are advantageously avoided in my new computation architecture by using flip-flops, counters and other circuit elements adapted to receive spiking inputs of the type generated by the above-noted neuron circuits. Important advantages arise from the use the spike-based computing architecture, and circuit elements, as described in the incorporated patent applications.

A further aspect of the incorporated patent application entitled Spike-Based Hybrid Computation is the use in some cases of analog-to-digital conversion techniques, e.g., in restoring analog signals to avoid significant degradation during transmission and processing over time. This restoration is convieniently performed as an analog-to-digital conversion followed by a digital-to-analog conversion. Thus, in the context of hybrid computation of the type described in this incorporated patent application, a simple digital-to-analog (D/A) converter is used to convert the A/D-converted value (from binary form) back to a continuous value—thus implementing an analog-to-digital-to-analog (A/D/A) conversion. It will be appreciated that such use of an A/D/A process effectively performs a rounding operation.

Because my spike-based hybrid computing architectures and circuitry achieve important performance and flexibility advantages, and because prior A/D converters are not well adapted for use with spiking neuron circuits and other spike-based circuitry, a need exists for Current-Mode Spike-Based Analog-to-Digital Conversion circuits and methods.

SUMMARY OF THE INVENTION

The limitations of the prior art are overcome and a technical advance is made and described herein in illustrative embodiments. In particular, A/D converter circuits and techniques are described that are useful when the input is a current and also prove useful in the context of spike-based computing of the type described above. Use of combined analog and digital circuitry employing spiking neuron signals contributes to high power and device implementation efficiencies. Present inventive circuits and techniques differ from prior AID designs in several respects.

A basic mathematical relationship that is exploited in the design of my converters is that between charge, Q, current, I, and time, t, i.e., $Q = I \times t$. The novel use of this relationship in A/D converters, rather than the more traditional ones of $V = I \times R$ (Ohm's law), or $Q = C \times V$ (charge relationship of a capacitor), affords many advantages as discussed below.

In a first aspect, present inventive contributions are charge-and-current based rather than voltage-based. In accordance with embodiments of the present invention, input current is not sampled at an instant, but rather is represented by its average effect in an integration period, i.e., by its charge-accumulation capabilities over time. Improved noise immunity is thereby realized. Further, no explicit sample-and-hold (S/H) circuit is necessary in application of the present inventive techniques, because integration of input current for a given time period on a capacitor is used instead. Advantageously, input signals are sensed only at one stage of the computation; all further information is coded in successive residues.

In accordance with another aspect of the present invention, no explicit subtractor is required in the present inventive architecture; subtraction is performed implicitly by resetting of a neuron. Further, there are no explicit digital-to-analog converters (DACs) between stages in embodiments of the present invention; a residue from the previous stage of conversion is automatically created in a form suited for the next stage of conversion. Subranging with implicit subtraction and interstage DAC conversion are thus embodied without introducing dynamic range problems in respect of the input charge; a lack of a large dynamic range of operation in any local neuron prevents speed degradation.

With the avoidance of such DACs, subtractors, inter-stage comparators, sample-and-hold circuits, and because comparison and amplification operations are combined in one 2-neuron circuit, present inventive architectures prove very area efficient for device implementation. Non-pipelined architectures are also used to advantage in embodiments of the present invention to further increase area efficiency, at least in part because coarse and fine conversions use the same 2-neuron circuit. The small number of circuit components that are required in illustrative embodiments increases the power efficiency as well. Power efficiency is further enhanced because charging currents need be present only when needed. The digital portions of our architecture, such as a spike-triggered state machine used to coordinate operations, consume switching power only when spiking events trigger transitions.

Other aspects of embodiments of the present invention that present a departure from prior A/D techniques include insensitivity to nonlinearities in voltage. While traditional voltage-mode architectures use capacitors in some cases, capacitive nonlinearity adversely affects the precision of inter-stage DAC conversion in such prior circuits. The insensitivity to nonlinearities in voltage arises because the nonlinear relationship between charge and voltage is irrelevant in the design of our converters, where voltage is merely an intermediate variable.

In another aspect of the present inventive architectures, the phenomenon of metastability, i.e., indecisive behavior between output '0' and '1' decisions in the converter, is avoided via the use of error correction of a large charge residue. Traditional A/D converters that perform voltage comparisons are prone to the adverse effects of metastability.

Other aspects of embodiments of the present invention permit both subranging ($I_{in}<I_0$) and overranging ($I_{in}>I_0$), where $I_0$ is a reference current, and are advantageously treated by the same architecture. A large dynamic range of operation is possible using the present inventive teachings, in part because our current-mode techniques are less prone to the effects of power-supply voltage limitations on dynamic range.

BRIEF DESCRIPTION OF THE DRAWING

The above summary will be more fully understood upon a consideration of the following detailed description of illustrative embodiments of the present invention and the included drawing wherein.

DETAILED DESCRIPTION

Figure 1:
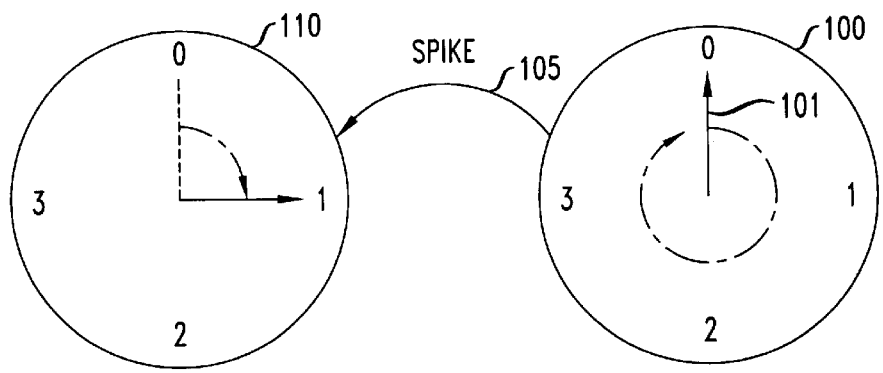
FIG. 1 shows spike-based computer signal representations for illustrative spike-based circuits and systems, such as hybrid computing systems.

Before proceeding to detailed descriptions of illustrative embodiments of A/D converters, some background on spike-based hybrid computation is first presented. This background provides a context for an exemplary use of these converters and also illustrates how these A/D converters may be viewed as special cases of a more general machine termed a hybrid state machine (HSM). Hybrid state machines are described in detail in my patent application concurrently filed with this application termed Spike-Based Hybrid Computation and are also described briefly here. It must be noted that the A/D converters described herein function as stand-alone current-input A/D converters and may be used in any application that benefits from current-input converters, independent of the context in which the application may arise.

Spike-based hybrid computation uses spikes (pulses) to compute in a fashion that is not purely analog or purely digital, but is a hybrid mixture of both forms of computation. Like digital computation, which uses several 1-bit precise logical units to collectively compute a precise answer to a computation, this hybrid scheme uses several moderate-precision distributed analog units to collectively compute a precise answer to a computation; frequent discrete signal restoration of the analog information prevents analog noise and offset from degrading the computation. The use of the underlying physics of the technology to compute, rather than logic, improves the efficiency of the computation in power or area.

In particular circuits and techniques for implementing distributed analog computation and discrete signal restoration will now be described with reference to FIGS. 1 and 2. It proves convienient in embodiments of the present invention to represent an analog state variable by the quantity of charge on a capacitor, $Q_{state}$. FIG. 2 shows illustrative capacitors 210 and 260 that serve to receive input charge. Each capacitor's state is advantageously changed by charging the capacitor with the sum of all its input currents $\Sigma_i I_i$. Unless otherwise mentioned, we will, for simplicity, also assume that all $I_i$ are positive, though no such restriction applies in the general case. The time period for integration of applied currents is taken as $t_{in}$, a period that is convieniently gated by a pulse input, or is ungated. It will be noted that in this representation, primitives already exist for an add operations (Kirchoff's current law) and multiply (Q=I×t). Since the inputs $I_i$ may themselves be linear or nonlinear functions of other input currents or voltages, such capacitor-based circuits provide, in general, the ability to implement a gated summation of various nonlinear input terms.

At some point, due to continuous charging, every analog state variable will likely reach the upper limit of its dynamic range, e.g., the power supply voltage—or a fraction of the power supply voltage. It proves convienient in many contexts to prevent this from occurring, as will be appreciated from the following discussion. So, a threshold level of charge, $Q_T$, is selected, such that if $Q_{state} \leq Q_T$, charging continues. But, if $Q_{state} > Q_T$, the state variable is reset to 0, and a signal is sent to a neighboring channel indicating that we have performed a reset; charging then resumes. Advantageously, the signal sent to the neighboring channel takes the form of a spike signal of the form described, e.g., in my incorporated patent application entitled "Spiking Neuron Circuit" filed concurrently with the present application and assigned to the assignee of the present application. The channel to which the illustrative spike signal is sent advantageously includes a similar charge-and-reset unit on another nearby capacitor. The spike then causes the neighboring channel to increment its charge by a discrete amount that is typically a fraction of $Q_T$.

Figure 2:
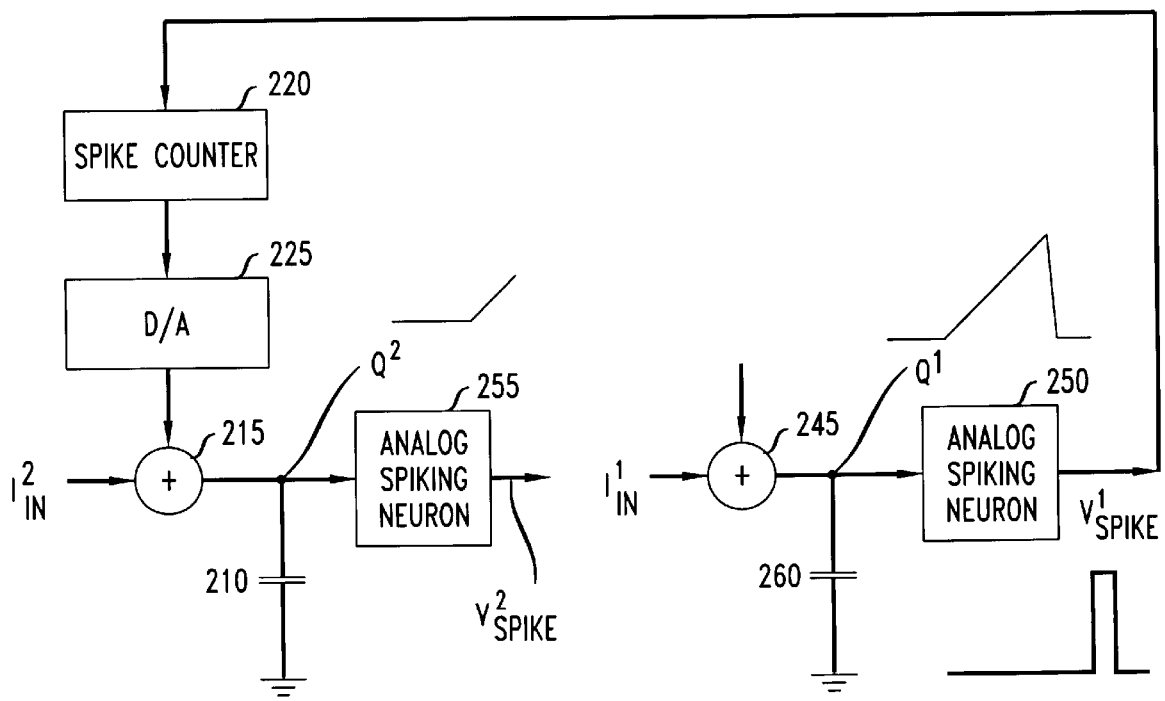
FIG. 2 shows an illustrative signal restoration arrangement for use with hybrid computation and, in particular, with A/D conversion operations in accordance with illustrative embodiments of the present invention.

FIG. 1 illustrates the charge-and-fire operation just described. Thus, a first circle 100 represents real numbers by their angular position of an arrow or vector 101 on the unit circle. When the phase of the rotating vector reaches $2\pi$, the representation "wraps around" by resetting to 0, with the accompanying transmission of a spike (or other) signal 105 to the neighboring channel (represented by circle 110). The illustrative spike signal indicates that the preceding accumulate-and-fire circuit has caused the corresponding charge signal representation to perform one full revolution.

(In some examples presented below a vector will be shown to rotate by an amount greater than $2\pi$. In these cases the rotation is conveniently indicated by a spiral or helix, the rotational extent of which does not necessarily reflect graphically the quantum of rotation. However, any quantitative valuation will be apparent to those skilled in the art from the context and progression of discussion.)

The adjacent channel, with its corresponding unit circle 110, keeps track of the number of full revolutions performed at its neighbor circle 100, by a rotational increment at circle 110. The charge thus deposited on the capacitor corresponding to the angular displacement on circle 110 typically reflects a charge of less than $Q_T$ on that capacitor. This idea can be repeated ad infinitum, so that complete revolutions of the cited neighbor circle are accounted for by partial increments of yet another channel, and so on. It will be recognized that the approach just described overcomes limitations of the prior art regarding limited-dynamic-range for an analog variable. The above-described strategy represents information about a variable across many channels.

So far operations have been defined on the set of real numbers. However, in accordance with the hybrid approach of representing only part of the information in each channel, it was recognized that it becomes necessary at some point in processing to restore and preserve that information. Thus, it becomes necessary to quantize a channel angle by rounding it up or down to the nearest discrete angle to which it is to be restored. For example, if two bits of information are represented per channel, at the time of signal restoration, only the quadrant of angular space the angular state is in is of concern. Thus, in the illustrative circumstances of FIG. 1, it is only necessary to round the state variable to whichever angle in the set $(0, \pi/2, \pi, 3\pi/2, 2\pi)$ the vector is closest to. If the vector 101 is closest to $2\pi$, we fire a spike and reset the variable to zero. For brevity, angles in the latter set are denoted on the circle by their ratio to $\pi/2$. The mathematics behind these operations is formalized by the following $$q_{state} = n(\pi/2) + \epsilon$$

$$n \in \{0,1,2,3\}$$

$$0 \leq \epsilon \leq (\pi/2) \tag{1}$$

$$[q_{state}] = n + \Theta(\epsilon - \pi/4)$$

$$q_{state} = \omega_{in} \times t_{in}$$

The function $\Theta(x)$ is the Heaviside function which is '1', if x>0 and 0 if x≤0. The function [x] is the floor function that rounds a real number to the nearest integer. The symbol $\omega$ represents an angular frequency that is determined by the sum of the charging currents.

One way of preserving the 2-bit representation across channels in is to increment the neighboring channel by $\pi/2$ whenever the current channel has finished a full revolution of $2\pi$. Such a scheme is illustrated in FIG. 2, where we charge the neighboring channel (the capacitor 210) by 1 unit when the current channel (capacitor 260) has completed a full revolution of 4 units. Continuing, if full revolutions of a neighbor result in a quarter-revolution increments of yet another neighbor to the left of it, and so on, a method is provided for approximating an analog number in a number representation based on radix 4.

In general, each of the channels of the described distributed number representation may also have its own analog input currents that arise from a source other than the immediate neighbor to their right. Thus, in the circuit of FIG. 2 spiking outputs from spiking neuron circuit 250 reflecting a full charge on capacitor 260 ($2\pi$ rotation of its corresponding vector) are applied by connection to the neighboring channel to create an incremental charge on capacitor 210 for that neighboring channel vector. The spiking signal from neuron circuit 250 advantageously is applied to current summer through a spike counter 220 and a (simple) digital-to-analog converter 225. While it proves convienient to have the number of spikes delivered at a neighbor channel summed and converted to a current for application to current summer 215 (in addition to other currents like $I_{in}^2$ in the illustrative circuit of FIG. 2), other arrangements for supplying the incremental current to the neighbor channel will occur to those skilled in the art. For example, an arriving spiking pulse can gate a standard charging current to the neighboring capacitor. This charging current may be chosen such that the charge is incremented by one unit. Such a scheme can be implemented using well-known circuit design techniques with as few as two transistors in series (one for gating and one for the current source). Any accumulated offsets due to mismatches in the current sources are irrelevant so long as we ensure that the sum of all these offsets is less than half the separation between discrete attractor levels prior to the roundoff operation.

It is important to note that this is not a multilevel logic scheme in radix 4 because we are computing on the set of real numbers with real-numbered primitives, which are resolution independent, and rounding off to the set of integers. In contrast, multilevel logic schemes compute on the set of integers with integer primitives that are resolution dependent (the number of levels and the radix change the logical rules completely). While the presently described primitives of computation are resolution independent (the law of adding 2 real numbers is the same independent of precision), the precision to which we may round a continuous number to its nearest discrete approximation is resolution dependent.

Returning to FIG. 2, it will be noted that input currents $I_{in}^2$ other than the inter-channel spiking input from neuron circuit 250 are applied to charge a capacitor. When the capacitor has received the threshold amount of charge (the capacitor has reached a corresponding threshold voltage) it fires a spike via a spiking neuron circuit. The inputs such as $I_{in}^2$ shown in FIG. 2 represent analog input currents to the respective channel for charging the respective channel capacitor to reflect signal conditions other than the spiking input from a neighboring channel. Thus arbitrary logic and arithmetic functions can be performed on circuits based on the present inventive teachings as represented in simple form in FIG. 2.

It is clear that if 5 discrete restoration angles are employed per circle, which can be represented as (0,1,2,3,4), the present scheme would operate in radix 5. In general, operation in any radix is possible and is determined entirely by the desired level of precision per channel. For simplicity of presentation, we will for following discussions assume that there are two bits of precision per channel unless otherwise mentioned. It should be understood, however, that the presently described systems and methods are not limited to any particular number of bits of precision per channel.

Hybrid State Machines

In the following sections of this detailed descriptions a number of figures and descriptions relating to the flow of operations in various analog-to-digital converter architectures will be presented. In these diagrams, spikes illustratively cause transitions from one mode of operation with one configuration of neuronal charging currents to another mode of operation with another configuration of neuronal charging currents. The neuronal charging currents in turn generate spikes. The class of machines so described are convieniently referred to as hybrid state machines (HSMs) and form the subject matter of my incorporated patent application entitled Spike-Based Hybrid Computation. It proves useful to now set forth in this application some aspects of HSMs to facilitate understanding of the present invention in its illustrative embodiments, and also because A/D converters are special cases of HSMs. For more details of HSM operation reference should be made to the incorporated application entitled Spike-Based Hybrid Computation.

Hybrid state machines possess both discrete digital states and continuous analog states, next-state functions for discrete and continuous states, analog and digital output functions, and interaction functions that define the interactions between the machine's analog and digital parts. In a departure from prior digital state machines, no clock is required—all transitions are triggered by spiking events. Illustrative spiking circuits and signals are described in my incorporated patent application entitled Spiking Neuron Circuit. It will be appreciated that traditional finite-state machines are a special case of hybrid state machines with only digital inputs, with only discrete states, and with only one special input (the clock) that is capable of triggering transitions between states.

Figure 3:
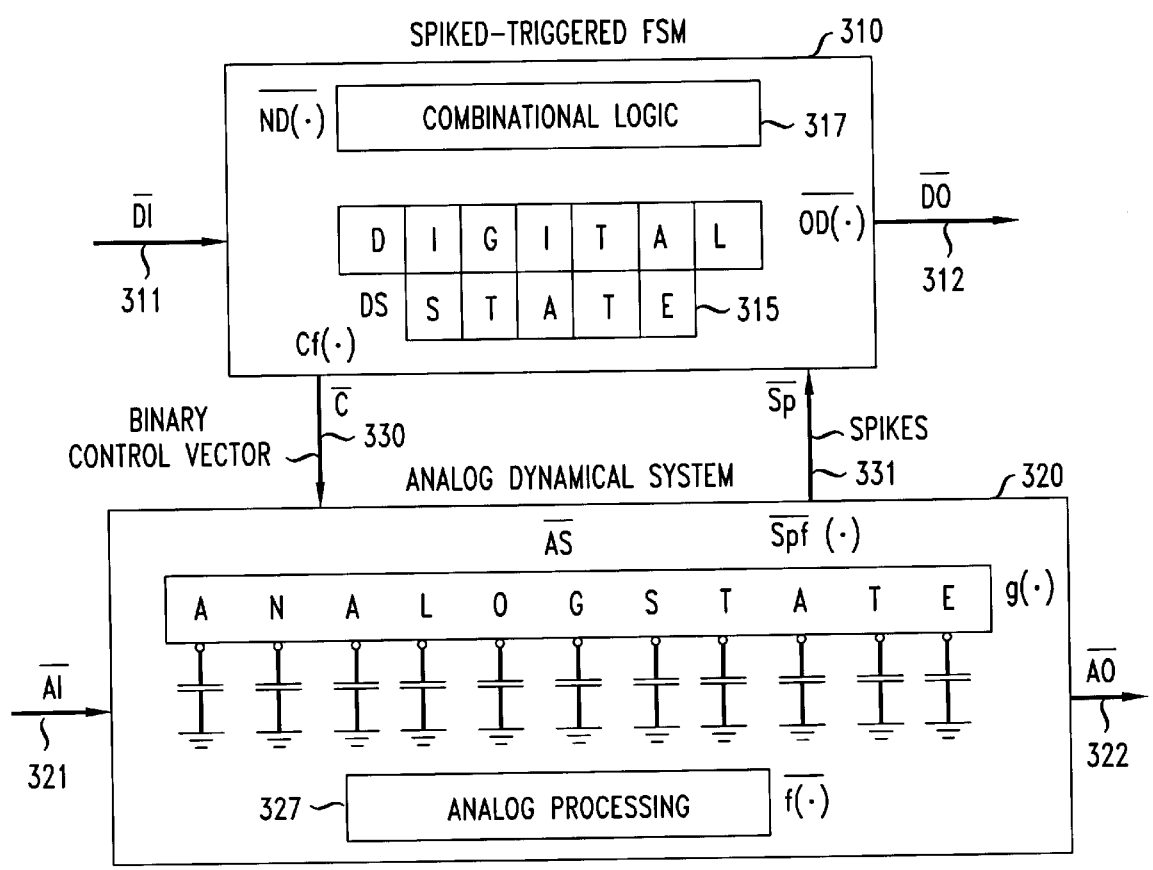
FIG. 3 shows a hybrid state machine useful in realizing a wide variety of hybrid computing structures, and including A/D structures and techniques of illustrative embodiments of the present invention. The organization of FIG. 3 also is applied at a different level in the realization of A/D structures of embodiments of the present invention.

FIG. 3 shows the architecture of an illustrative hybrid state machine. There, the machine is shown comprising two principal parts: (i) an analog part 320 with analog states (illustratively encoded on a set of capacitor charge variables), and with analog inputs and outputs AI and $\overline{AO}$ on leads 321 and 322, respectively; and (ii) a digital part 310 with discrete states DS encoded on a set of register variables stored in register 315 and having digital inputs and outputs $\overline{DI}$ and $\overline{DO}$ on leads 311 and 312, respectively. Analog part 320 also comprises analog processing element (s) 327, while digital part 310 further comprises combination logic 317.

In each discrete state, digital part 310 may alter the values of a set of binary outputs (binary control vector, 330) to control switches in the analog part 320, consequently affecting the analog system's operation. In turn, analog part 320 generates spiking events as an output spike vector, $\overline{Sp}$, which triggers transitions between discrete states in digital part 310.

Digital control of the analog part 320 of the hybrid state machine of FIG. 3 may be exercised in at least three ways. In a first form of operation, D/A converters (DACs) explicitly convert digital control bits to physical analog parameters to affect the operation of analog system 320. For example, in a particular state, a current equal to $4I_0$ will illustratively be created by switching particular control bits supplied to a DAC to the bit pattern 100. This $4I_0$ current then changes the state of a capacitor in analog system 320 for which this current is a charging input. Any analog parameters such as thresholds, pulse widths, charging currents, capacitance values etc. may be altered this way.

In a second form of control exercised by digital part 310, digital control bits alter the parameters of analog system 320 by setting selected analog parameters to zero while enabling other analog parameters to express their value. For example, an analog input current, $I_{in}$, from outside the hybrid state machine may be allowed to assume its value during a sensing operation or it may be effectively set to zero, depending on the state of a specified control bit.

In a third form of control exercised by digital part 310, digital control bits may reconfigure an analog topology by turning on or off particular switches included in analog processing unit 327 in analog portion 320. For example, an operational amplifier that is present in the analog system may be disconnected from the rest of the system when a particular digital control bit is 1.

Control by analog part 320 of digital part 310 is effected by having particular spikes or particular spiking patterns trigger transitions between the discrete states. In the following descriptions it will be shown by way of illustration that arbitrary spiking patterns may be recognized by a hybrid state machine that has all its transitions triggered by the arrival of a particular spike. The particular spike used to effect this transition may differ from state to state, but any given transition is always caused by one spike. This spike-pattern-recognition machine may be embedded within a larger hybrid state machine and have the spike-pattern-recognition machine generate a spike when the appropriate spiking pattern is recognized. Thus, without loss of generality, we may assume that all hybrid state machines make transitions based on only a single triggering spike. However, transitions between discrete states may be conditioned on a spike arrival as well as on the states of other digital inputs. The digital portion of a hybrid state machine (styled a spike-triggered finite state machine) is described in detail in my incorporated patent application filed on the same day as the present application and entitled A Spike-Triggered Asynchronous Finite State Machine.

Because robust nonvolatile analog memory is difficult to realize in practice, we will generally assume that analog states are volatile and destructible, at least over a long time scale. Nonvolatile digital state is easily realized using such devices as SRAMs. Thus, if it is important to store analog state variables over a time scale that is much longer than the typical leak time of capacitors used in analog part 320, it will prove convienient to perform analog-to-digital conversion to the precision needed and store the analog state digitally. Such conversion will be described more fully below.

Further, as is clear in light of the present teachings, a hybrid state machine for performing A/D conversion is readily embedded within a larger hybrid state machine. In such a context, it proves convienient to transition from states of the larger machine to states of the conversion machine when we wish to perform analog-to-digital conversion, and then return to the large machine when we complete the conversion. Thus, using this technique, we have effectively created an analog-to-digital-conversion "subroutine" that we call from a larger (hybrid state machine) program. If we need to recreate some analog state on a capacitor, and this state has been stored digitally, we employ a standard digital-to-analog converter to charge the capacitor for a fixed amount of time with a current that represents the result of the digital-to-analog conversion.

Certain changes in discrete states in digital part 310 of the hybrid state machine of FIG. 3 may result in no changes in analog part 320. For example, in illustrative A/D architectures to be described more fully below, counting spikes in a particular phase of A/D conversion alters the discrete states of a counter - but does not affect any analog parameters. Analog parameters advantageously change only after a transition to another phase of operation; such a transition is illustratively triggered by spikes that are not related to the spikes counted in the prior phase of operation.

Analog-to-Digital Conversion

To facilitate the discussion of other inventive architectures for A/D conversion, we first introduce some concepts of counting and error correction using novel illustrative neuron operations.

Counting

Figure 4A:
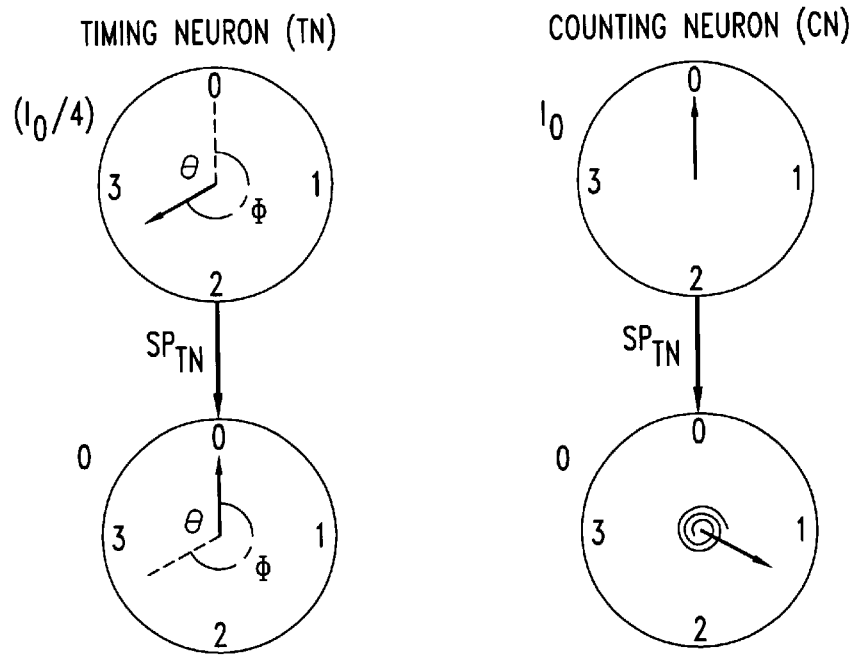
FIGS. 4A and 4B illustrate neuron-based upcounting and downcounting in A/D conversion in accordance with illustrative embodiments of the present invention.

FIG. 4A shows the angular state variables of 2 spiking neurons, called the timing neuron (TN) and counting neuron (CN) respectively. Initially, the counting neuron has an angular state variable that is zero, while the timing neuron has its angular state variable equal to $-\theta$, or equivalently to $\phi = 2\pi - \phi$. If we now charge CN with a current equal to $I_0$, while we charge TN with a current equal to $I_0/4$, then, the charging rate of CN is 4 times that of the charging rate of TN. If we stop charging both neurons as soon as TN spikes, i.e. as soon as $Sp_{TN}$ becomes active, we will cause CN to increment its state variable by $4\theta$ in the time that TN increments its state variable by $\theta$. Thus, if $$\theta = n\pi/2 + \epsilon \tag{2}$$

where, $$0 \leq \epsilon \leq \pi/2 \tag{3}$$

$$n \in (0,1,2,3) \tag{4}$$

then, $$4\theta = n(2\pi) + 4\epsilon \tag{5}$$

Hence, CN will make n full revolutions and fire n spikes in the time that it takes TN to fire 1 spike, by counting the number of spikes that CN fires, we may evaluate $\theta$ rounded down to the nearest whole multiple of $\pi/2$.

The arrow in FIG. 4A is labeled $Sp_{TN}$ to indicate that a state transition occurs at the onset of this spike. After this state transition, the charging currents to the neurons are altered; in FIG. 4A and FIG. 4B, after the state transition, the charging currents to both neurons are 0, but, in general, the charging currents could be altered to values dictated by subsequent processing. The charging currents for each neuron in a given state are labeled alongside the diagrammatic representation of their state variables at the beginning of the state.

Figure 4B:
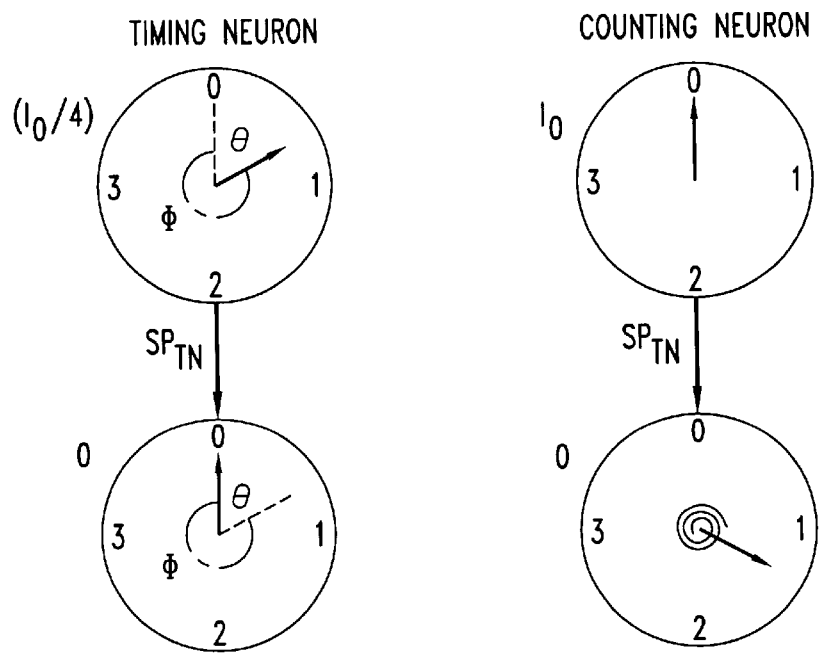

FIG. 4B shows the same two neurons, but with the angular state variable of TN initially at $+\theta$ rather than $-\theta$. This case is equivalent to the case discussed with reference to FIG. 4A except that the multiply-by-4 operation is on $2\pi - \theta$ rather than on $\theta$. Thus, $$4(2\pi - \theta) = 4(2\pi - (n\pi/2 + \epsilon)) = (4-n)2\pi - 4\epsilon, = (3-n)2\pi + (2\pi - 4\epsilon), \tag{6}$$

and, the number of spikes fired by CN in the time that TN takes to fire one spike is $3-n$. Thus, if we start at 3, and downcount the number of spikes fired by CN, we may evaluate $\theta$ rounded down to the nearest whole multiple of $\pi/2$.

The technique of FIG. 4A is referred to as upcounting and the technique of FIG. 4B is referred to as downcounting. Eq. (6) shows that when we do a downcounting evaluation of $\theta$ we are left with a residue $2\pi - 4\epsilon$. This residue is in a form suitable for further evaluation by upcounting. Similarly, Eq. (5) shows that when we do an upcounting evaluation of $\theta$ we are left with a residue $4\epsilon$. This residue is in a form suitable for further evaluation by downcounting.

The techniques of upcounting and downcounting enable us to do a coarse evaluation of $\theta$ to the nearest whole multiple of $\pi 2$, leaving a residue for finer evaluation in a subsequent stage of processing: The $[0,\pi/2]$ range of $\theta$ is amplified to $[0, 2\pi])$ for the fine stage evaluation. By successively alternating upcounting and downcounting evaluations, we may get finer and finer estimates of $\theta$. These successive evaluations form a basis of the analog-to-digital conversion technique described in detail below.

In practical circuits, $I_0/4$ is never exactly $I_0/4$; such circuits also have other errors and offsets. Hence, the operations represented in FIG. 4A and FIG. 4B may result in 4 spikes being fired, although the mathematics would predict that this situation could only arise if $\theta$ were exactly zero. In the upcounting case, the fourth spike is interpreted to mean that, within the resolution of our conversion, $=2\pi$, and $\epsilon=0$, in the downcounting case, the fourth spike is interpreted to mean that, within the resolution of our conversion, $\theta=0$, and $\epsilon=0$. The firing of 4 spikes creates a zero residue and terminates any finer stages of evaluation. The precision of the conversion is thus necessarily limited by the precision to which we can evaluate small angles in the first stage of conversion.

Error Correction

Figure 5:
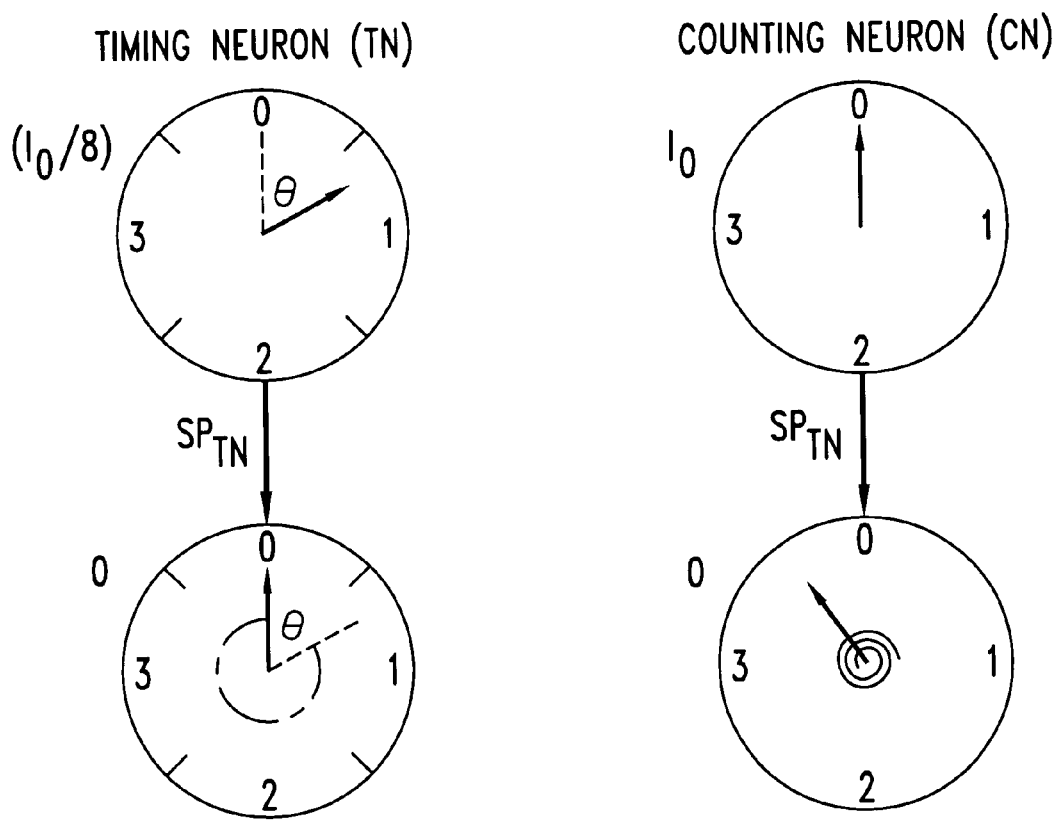
FIG. 5 illustrates error correction mechanisms in A/D conversion in accordance with illustrative embodiments of the present invention.

At the last stage of A/D conversion using techniques like those just described, no residue can be left for further processing to evaluate. It is then necessary to round up or round down the value of θ to correctly evaluate the least significant bit of the conversion. FIG. 5 shows how we perform error correction in an architecture where the last stage of the conversion involves downcounting; extension of the technique to an architecture where the last stage of the conversion involves upcounting is straightforward.

When rounding up or down, we are interested in knowing the value of θ to a resolution given by π/4, rather than π/2. In FIG. 5, for example, θ would need to be rounded up to 1(π/2) since its value exceeds π/4, making it closer to π/2 than to 0; if its value were less than π/4, it would need to be rounded down to 0. In FIG. 5, the π/4 subdivisions have been indicated as tick marks between the main π/2 divisions. To make decisions based on π/4 divisions, we perform multiply-by-8 operations that map each π/4 sector to a π2 sector: The presence (or absence) of spikes caused by complete 2π. revolutions can then serve as an indicator of θ's resolution with respect to a π/4 angular grid. The details of this multiply-by-8 technique are described in the following paragraph.

In the downcounting architecture, a multiply-by-8 operation is described by $$8(2\pi-\theta)=(7-n')2\pi+(2\pi-8\epsilon'), \quad (7)$$

where $$0 \leq \epsilon' \leq \pi/4, \quad (8)$$

$$n' \in (0,1,2,3,4,5,6,7). \quad (9)$$

The mapping between the number of spikes fired (7−n', unless ε is evaluated to be 0, in which case it is 8−n'), and n (from Eq. (2)–Eq. (4)) is then given by Table 1.

| Spikes Fired | n |
| --- | --- |
| 0 | 4 |
| 1,2 | 3 |
| 3,5 | 2 |
| 5,6 | 1 |
| 7,8 | 0 |

Table 1: Downcounting Error Correction

We only change our estimate of n when an odd number of spikes has been fired. If no spikes are fired, we interpret n to be 4; generating a carry to an adjacent channel usually represents the value of 4. The compressive nature of the mapping (more than one value in the number of spikes fired results in the same n) provides error correction, i.e., rounding of n to its nearest value such that the LSB is evaluated correctly.

Similarly, it is easy to show that in an upcounting architecture, the mapping between the number of spikes fired, and n is given by Table 2.

In a downcounting architecture, the tabular mapping of Table 1 is easily implemented by reading the 1st and 2nd most significant bits of a 3-bit spike-triggered counter that has been initialized to 000. We downcount as each n' spike arrives; a simple circuit generates an overflow carry to represent 4 in an adjacent channel in the absence of any spike arrivals.

Similarly, in an upcounting architecture, the tabular mapping of Table 2 is easily implemented by reading the 1st and 2nd most significant bits of a 3-bit spike-triggered counter that has been initialized to 001. We upcount as each n' spike arrives. In a manner similar to the downcounting arrangement, a 00 in the 2 most significant bits of the counter and the presence of at least one spike arrival generate an overflow carry.

| Spikes Fired | n |
| --- | --- |
| 0 | 0 |
| 1,2 | 1 |
| 3,5 | 2 |
| 5,6 | 3 |
| 7,8 | 4 |

Table 2: Upcounting Error Correction 2-step A/D Conversion

Figure 6:
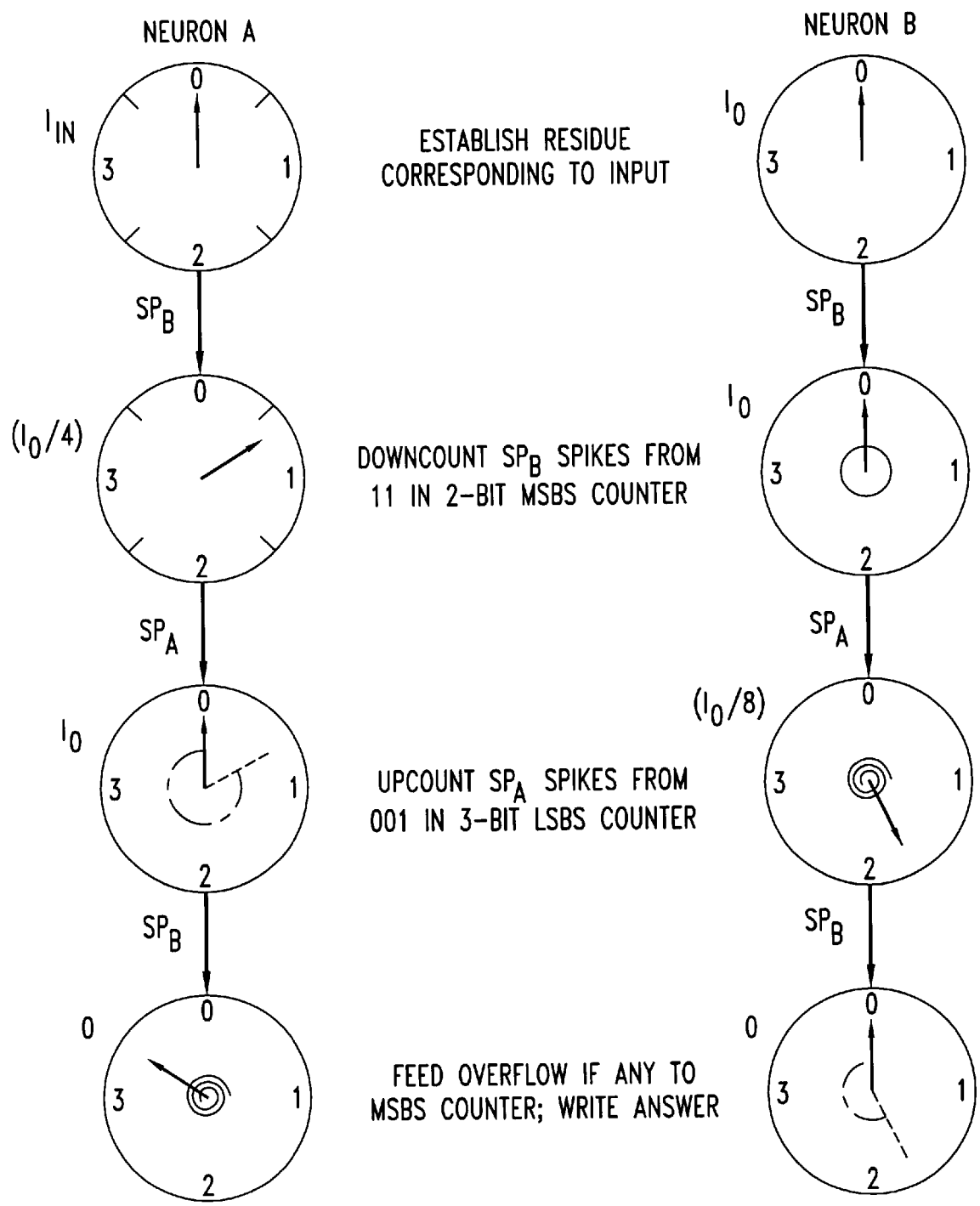
FIG. 6 illustrates operations performed in 2-step A/D conversion in accordance with illustrative embodiments of the present invention.

FIG. 6 shows an architecture for a 2-step A/D converter. The converter first performs a 2-bit coarse quantization followed by a 2-bit fine quantization of the residue from the coarse quantization. The architecture comprises two neurons whose states and charging currents evolve during the process of conversion as shown in FIG. 6. There are 4 discrete states in the conversion process, in each of which there is a different configuration of charging currents for the two neurons. In FIG. 6 the state of each neuron at the beginning of the discrete state, and the charging currents for the 2 neurons in each state are indicated.

1. To begin with, both neurons marked A and B have their angular state variables reset to zero. To establish the residue needed for the conversion, neuron A is charged with an input current $I_{in}$, while neuron B is charged with a reference current $I_0$, with $I_0 > I_{in}$. When neuron B spikes, i.e. $SP_B$ is active, we transition to the second discrete state.

2. At the beginning of the second state, neuron A encodes information about $I_{in}$ as an angular residue, while neuron B has just finished firing a spike and has its angle equal to zero. The residue of neuron A is given by $(I_{in}/I_0)2\pi$. We now charge neuron A with a current equal to $I_0/4$, while we charge neuron B with the reference current $I_0$; effectively, we have created a multiply-by-4 downcounting operation as described in section 4.1. By downcounting the spikes from neuron B (with Neuron B functioning as the counting neuron while neuron A is functioning as the timing neuron) in a 2-bit counter that has been initialized to 11, we obtain the result of our coarse quantization. The counter is referred to as the MSBs counter because its value at the end of this state encodes the 2 most significant bits of the answer. Note that if 4 spikes are fired in this state, then we evaluate $I_{in,\ to\ be}$ 0 (which corresponds to an MSBs counter overflow), the residue for the fine quantization is interpreted to be near zero—no fine quantization is necessary—and we are done. As Eq. (6) shows, the residue of neuron B is now in a form that may be evaluated by upcounting. We transition out of this state when neuron A spikes, i.e., $Sp_A$ is active.

3. We combine upcounting and error correction in the third state by performing an upcounting multiply-by-8 operation: Neuron A is charged with a current of $I_0$, while neuron B is charged with a current of $I_0/8$. Both charging currents persist until the onset of $Sp_B$. By upcounting the spikes in a 3-bit LSBs counter initialized to 001 as described above, we obtain the 2 least-significant bits of our quantization as the first and second most-significant bits of the 3-bit counter.

4. In the fourth state, we perform bookkeeping operations: If there have been any overflows in the LSBs counter (7 or 8 spikes fired as Table 2 shows), then we increment the MSBs counter by 1. In this state, we may also wish to write the answers of the counters to external registers. The neurons have no charging currents in this state and may be reset to zero if desired. The whole A/D conversion process may begin anew by a transition from this state to the first state when and if an asynchronous input requests conversion.

The discrete states, and spike-triggered transitions required of A/D conversion are implemented with a spike-triggered finite state machine; the machine's outputs control the configuration of charging currents to the neurons. An illustrative finite-state machine for use in this context is described in the incorporated patent application entitled A Spike-Triggered Asynchronous Finite State Machine. The combination of the several illustrative spike-based analog circuits (such as the 2-step A/D converter just described) with spike-triggered finite state machines falls within the broad category of hybrid state machine as note above and described in detail in the incorporated patent application entitled Spike-Based Hybrid Computation.

Successive-Subranging Architectures

Figure 7:
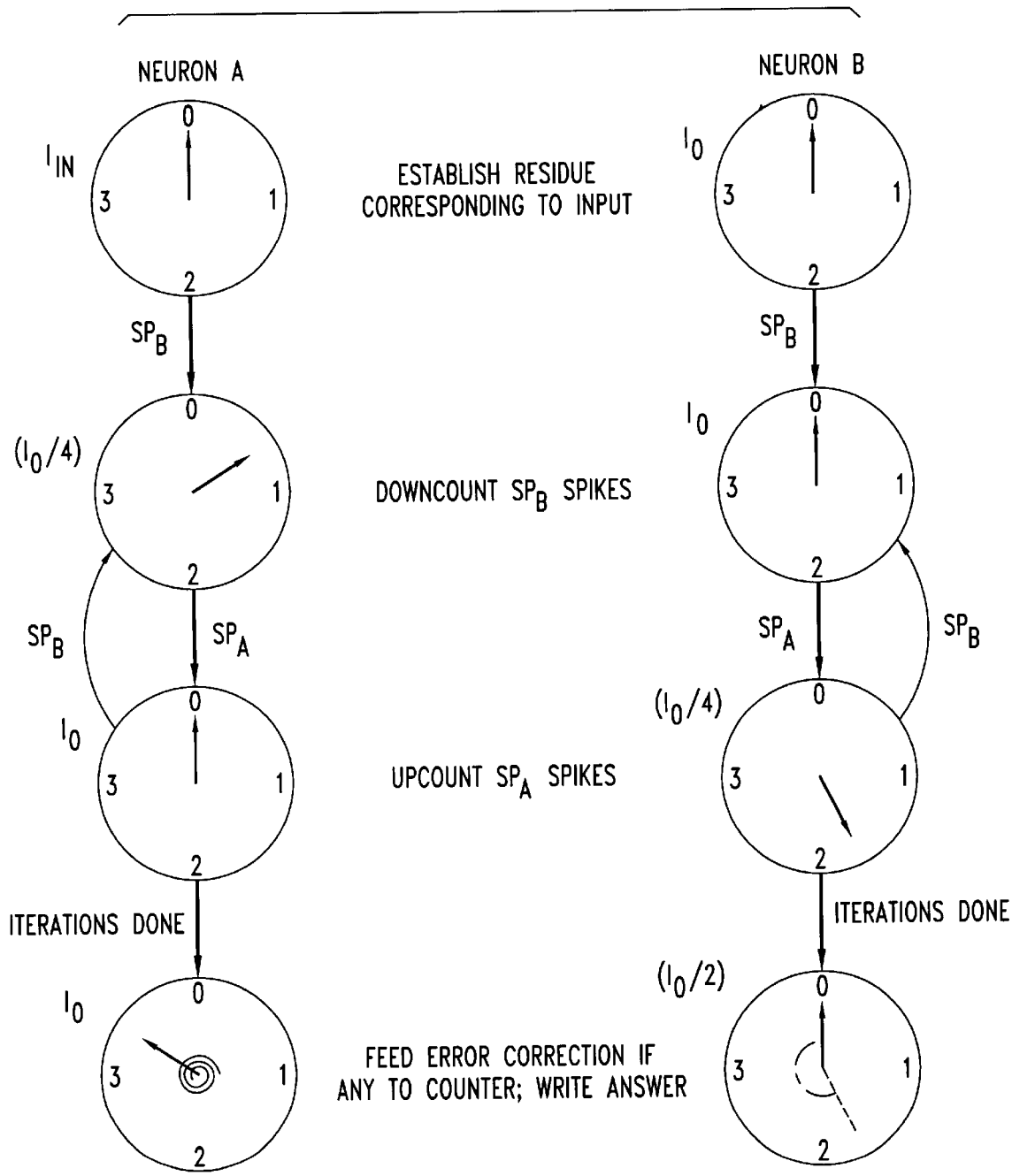
FIG. 7 illustrates aspects of successive subranging in A/D conversion in accordance with illustrative embodiments of the present invention.

FIG. 7 shows an A/D architecture that we term a successive subranging architecture. A pipelined version of this architecture is described below. Here, we constantly alternate between downcounting and upcounting stages of residue evaluation to attain finer and finer estimates of the residue. In each stage of processing, a quantization is performed, and the residue is amplified and input to the next stage of processing where the process repeats again. We may think of this process as viewing the residue at successively higher magnifications. At each magnification, we extract an integer measure of the residue and amplify the residual fraction for the next stage to evaluate.

The mathematical foundation for this technique lies in Eq. (6) and Eq. (5) respectively. Eq. (6) shows that downcounting results in an integer evaluation of 3−n, and a fractional residue that is amplified by 4 and in a form that is exactly suited for finer evaluation by an upcounting stage. The finer evaluation results because we map $\epsilon$, which exists in a $[0, \pi/2]$ range, to a $[0, 2\pi]$ range. Furthermore, the fractional residue is in the form $2\pi-4\epsilon$ which allows us to perform a direct evaluation of $4\epsilon$ in an upcounting stage.

Eq. (5) shows that upcounting results in an integer evaluation of n, and a fractional residue that is amplified by 4 and in a form that is exactly suited for finer evaluation by an downcounting stage. The finer evaluation results because we map $\epsilon$, which exists in a $[0, \pi/2]$ range, to a $[0, 2\pi]$ range. Furthermore, the fractional residue is in the form $4\epsilon$, which allows us to perform a direct evaluation of $4\epsilon$ in a downcounting stage.

FIG. 7 illustrates the details of the architecture which is implemented with two spiking neuron circuits, neuron A and neuron B, and is composed of four discrete states.

1. In the first state, both angular state variables are reset to zero, and neurons A and B are charged with an input current of $I_{in}$ and $I_0$, respectively, to establish an angular residue of $(I_{in}/I_0)2\pi$ on neuron A. We transition out of the first state upon activation of $Sp_B$.

2. In the second state, we perform a downcounting evaluation of the residue on neuron A by performing a multiply-by-4 operation: Neuron A is charged with $I_0/4$, and functions as the timing neuron, while Neuron B is charged with $I_0$ and functions as the counting neuron. The $Sp_B$ spikes are downcounted in a 2-bit spike-triggered counter that is initialized at 11. We transition out of this state when $Sp_A$ becomes active.

3. In the third state, we perform an upcounting evaluation of the residue left on neuron B by the processing of the previous state. The upcounting is accomplished by having neuron B as the timing neuron with a charging current of $I_0/4$, and, by having neuron A as the counting neuron with a charging current of $I_0$. The $Sp_A$ spikes are upcounted in a 2-bit spike-triggered counter which has been initialized to 00. We transition out of this state to return to the 2nd discrete state when the timing neuron fires its $SP_B$ spike. We continue to alternate between downcounting evaluations in the 2nd discrete state and upcounting evaluations in the 3rd discrete state until we have performed the desired number of iterations of successively finer quantization; these iterations are accounted for in a state variable of the system.

4. In the fourth state, we perform error correction to get the LSB of the conversion correct. We perform a multiply-by-2 operation to see whether the final residue on neuron B is less than or greater than $\pi$. If it's more than $\pi$ (no spike is fired on neuron A), then we increment the final 2-bit LSB counter by 1. If it's less than $\pi$ (a spike is fired on neuron A), then we do not increment the final 2-bit LSB counter. The error correction performs rounding of the residue left after the last stage of upcounting evaluation: In prior descriptions, the rounding and evaluation were performed in a single multiply-by-8 operation. In this discussion, the multiply-by-8 operation has been divided into a multiply-by-4 operation and a multiply-by-2 operation. The multiply-by-4 evaluation operation is illustratively performed in the last stage of upcounting evaluation. The multiply-by-2 error-correction operation is convieniently performed in the final error-correction stage. It will be recognized that concept of evaluating the final residue on an angular grid with tick marks halfway between the main divisions ($\pi/4$ tick marks rather than $\pi/2$ tick marks) remains unchanged, and this idea is still the basis of the error-correction mechanism described here: The last evaluation stage causes a multiplication by 4 that maps sectors with angles of $\pi/4$ to sectors with angles of $\pi$ ; a multiply-by-2 operation then maps the resulting $\pi$ sectors into $2\pi$ sectors and enables a roundoff judgement to be made on whether a spike is fired or not.

Note that incrementing the final 2-bit LSB counter during error correction can cause the incrementing carry to propagate through to the other more significant 2-bit counters; these counters may be viewed as being chained together to create a global counter that represents the answer of the conversion.

At any point of the conversion, if 4 spikes are fired in an upcounting stage, the counter corresponding to this stage is set to zero, we generate a carry that propagates to the adjacent higher-order counter, and terminate the conversion since the residue is interpreted to be zero. Similarly, if 4 spikes are fired in a downcounting stage, we set the downcounting counter to zero, and terminate the conversion.

Pipelined Architecture

Figure 8:
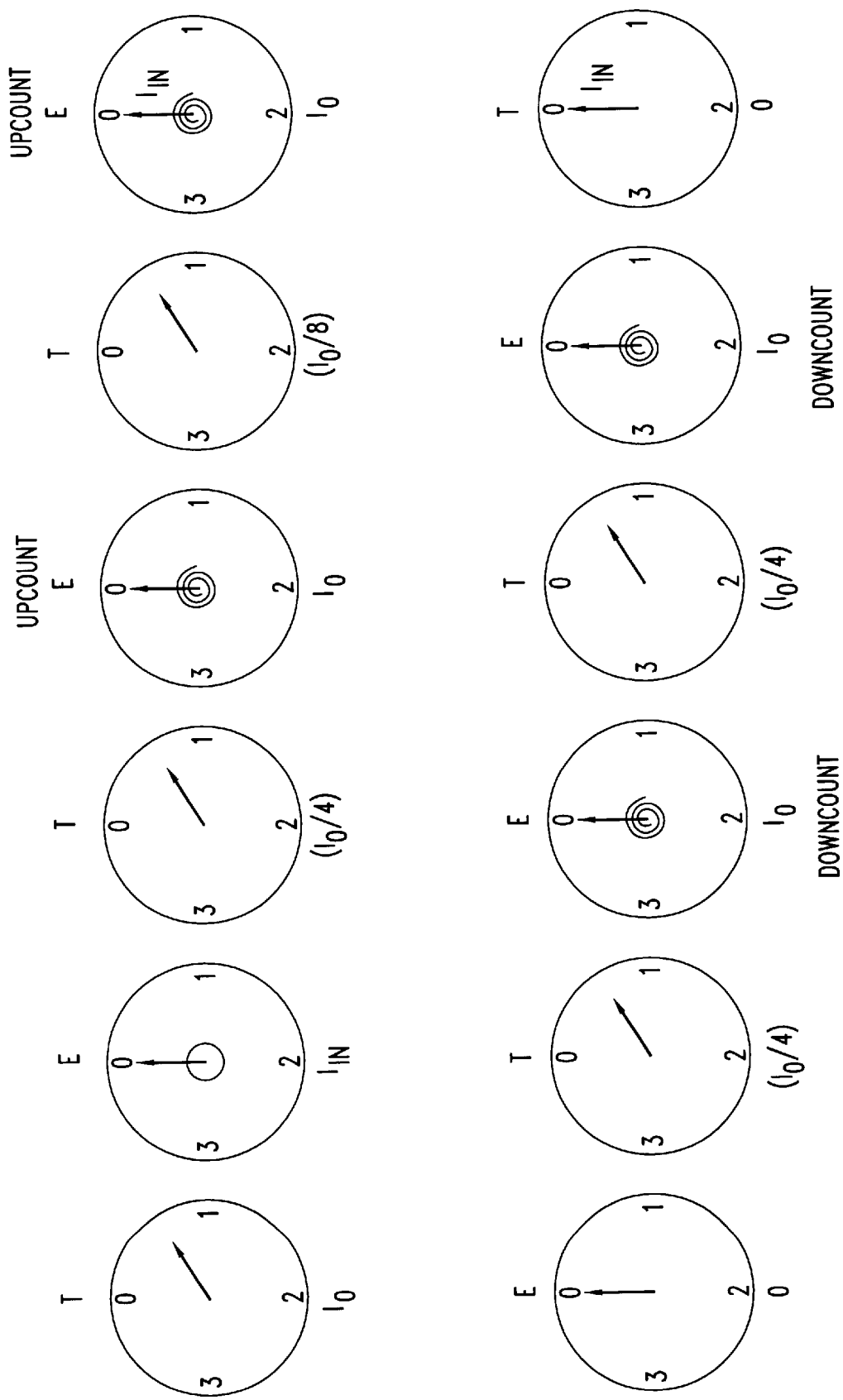
FIG. 8 illustrates pipelined A/D conversion.

FIG. 8 shows how we may construct an 8-bit pipelined successive-subranging converter. We have a cascade of 6 neurons that spatially alternate in assuming timing (T) and evaluation (E) modes. The T-neurons control the evaluation period of the neighboring E-neuron to their right by determining this E-neuron's time period of charging. The E-neurons generate upcounting/downcounting spikes and create a residue by amplification of the T-neuron's residue.

However, the first E-neuron in the cascade creates a residue, not via amplification, but via charging from the input current. Any E-neuron at a given location always upcounts/ downcounts (or doesn't count if its the 2nd neuron during input charging), and there is an alternation of upcounting/ downcounting stages. When all the T neurons having non-zero charging currents have finished firing their spikes, we enter a mode of operation where the T-neurons become E-neurons, and the E-neurons become T-neurons. The two rows of FIG. 8 illustrate the two configurations that the A/D converter is constantly alternating between. The residue is thus asynchronously evaluated, amplified, and passed amongst the neurons from left to right in a pipelined fashion.

The first neuron in the cascade of FIG. 8 is used to time the generation of the input residue on its neighbor. It behaves as a T-neuron when it performs this function, and is inactive (zero charging current) when it is an E-neuron. The very last neuron in the cascade performs the final error correction and evaluation. It behaves as an E-neuron when it performs this function, and is inactive when it is a T-neuron.

As noted above, errors may cause each E-neuron to output 4 spikes; the error-correction mechanism involves propagating carries to adjacent channels, and terminating the following stages of conversion. Such a correction mechanism can substantially complicate the asynchronous timing interactions of the converter. One solution is to maintain a 3-bit counter at each upcounting/downcounting stage. The most significant bit of this counter is 1 if 4 spikes are fired and 0 otherwise. If this bit of the counter is reported along with the 2 primary bits, then, simple digital arithmetic and logical stages are advantageously used to perform the carry-propagation and termination operations; these operations are convieniently performed as post-processing operations beyond the A/D conversion.

As in any pipelined architecture, the stages to the left in FIG. 8 are simultaneously processing new inputs while the stages to the right are processing old ones. If particular applications or contexts suggest a conversion of the pipeline architecture of FIG. 8 into a traditional synchronous pipeline form, this may be readily accomplished by alternating the T and E modes of each neuron on two phases of a clock. In so doing, the clock period must be at least as large as the time taken by the slowest charging current in the system ($I_0/8$) to create a spike in the worst case ($\theta=0$) as well as allow time to write the counters. The outputs of the counters in this synchronous mode are latched in registers that alternate between write-mode when the corresponding neuron is in E-mode, and hold-mode when the corresponding neuron is in T-mode.

Extensions of the Basic Ideas

The basic ideas of performing multiplication operations on angular residues have been applied in the foregoing descriptions to various contexts to perform 2-step, successive-subranging, and pipelined A/D conversion. A number of modifications and extensions of these techniques that will prove valuable in a variety of applications include:

1. We may perform operations in any radix, not necessarily radix 4 in which the above examples have been couched. Operation in different radices simply corresponds to a selection of the grid used to express angular charge variables. Thus, a 2-step A/D conversion in radix 6 will employ multiply-by-6 operations, and error correction are performed via one multiply-by-12 operation (as discussed for the illustrative 2-step architecture), or via one multiply-by-6 and one multiply-by-2 operation (as discussed for the illustrative successive- subranging architecture). In a pipelined architecture, we may obtain more than or less than 2 bits per stage.

2. The successive-subranging topology may terminate in a downcounting stage rather than in a upcounting stage as discussed above. If so, during the error correction multiply-by-2 stage, the presence of a spike causes the LSB counter to be incremented and vice versa.

3. If $I_{in}>I_0$, it is possible to count the spikes fired by $I_{in}$ on a counting neuron during the time that it takes $I_0$ to charge a timing neuron to fire one spike. This methodology may be viewed as a technique for handling overranging of the input when compared with the reference. The residue after the overranging stage may be evaluated by any of the various subranging techniques described. If the residue is ignored, overranging is a method for performing 1-step A/D conversion.

4. It is possible to have different radix representations for different parts of the conversion. For example, we may evaluate a first residue with a radix-of-4 representation, and then evaluate the second residue with a radix-of-8 representation.

5. In the successive-subranging architecture, rather than have a separate state to do a multiply-by-2 error-correction operation, we may have the last upcounting/downcounting state directly perform a multiply-by-8 operation. The multiply-by-8 operation then combines evaluation and error correction.

6. Any combination of individual techniques, e.g., over-ranging followed by 2-step residue evaluation and error correction, or 3-step residue evaluation with a final step of error correction, will find application in particular circumstances. The implementation of any of these combinations will be apparent from the present inventive teachings.

7. We may attain A/D conversion with programmable precision if digital control logic is used to alter the number of stages of subranging conversion, or if the radix used for conversion is altered.

8. Scaling ratios for multiplications are readily obtained by scaling the charging capacitances in the various neurons, rather than by scaling the currents.

An overrange-subrange 2-step A/D converter

This section describes an example 4-bit A/D converter in the form of a semiconductor chip that may illustratively be built using a 0.5 μm HP MOSIS process with a 3.3 V power-supply voltage.

Figure 9:
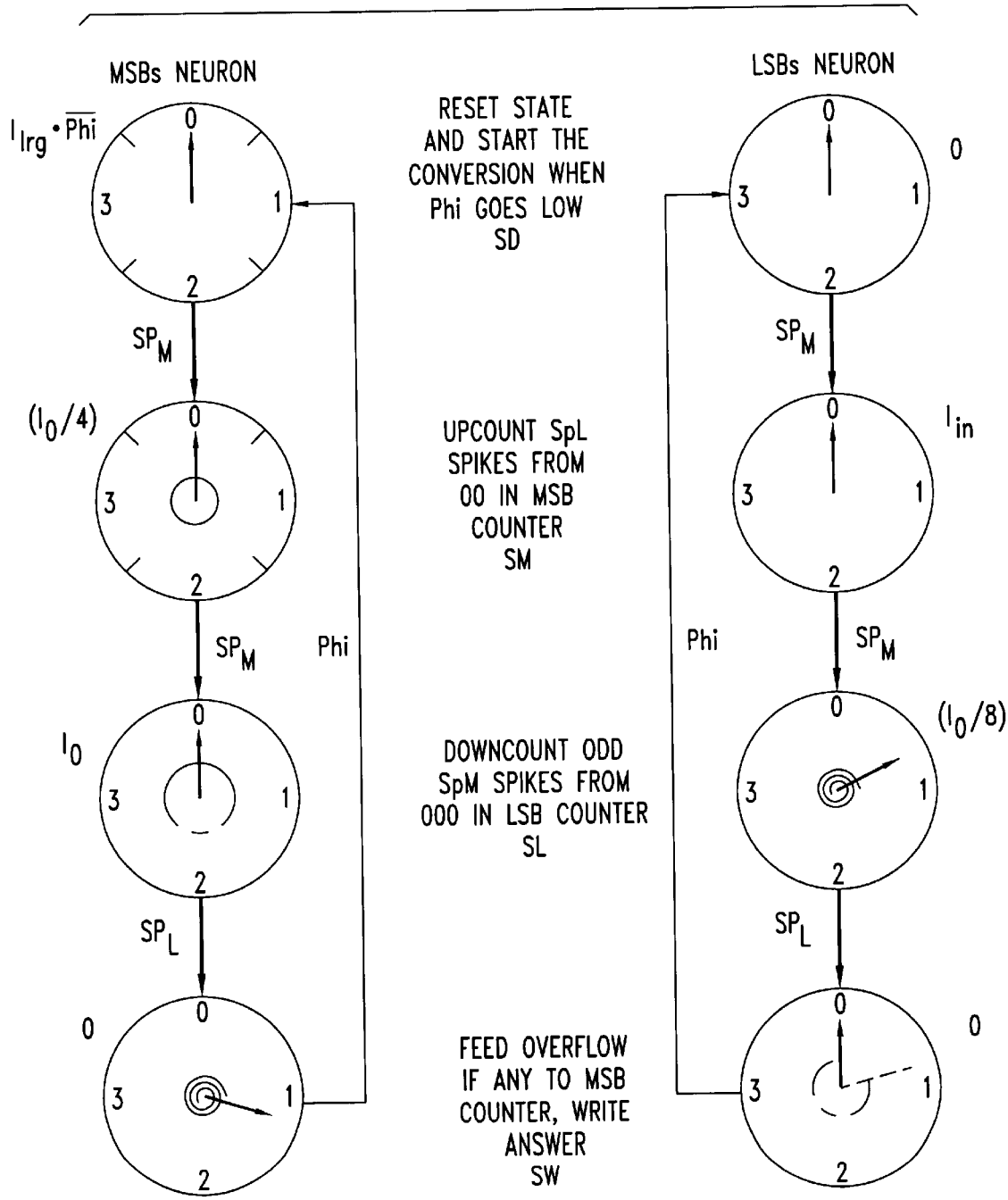
FIG. 9 illustrates overrange-subrange 2-step A/D conversion in accordance with illustrative embodiments of the present invention.

The converter obtains its 2 most significant bits via an overranging step, and its 2 least significant bits via a 2-bit residue-evaluation and error-correction step. The flow diagram for the evolution of the converter is shown in FIG. 9. There are four discrete states and two neurons labeled the MSBs-neuron and LSBs-neuron respectively.

1. The first state, SD, may be viewed as the default reset-and-wait state. Both angular state variables are reset to zero, and we wait for the control input Phi to go low. When Phi does go low, a large current $I_{lrg}$ is used to cause the MSBs-neuron to quickly spike. The activation of $Sp_M$ causes a transition to the second state.

2. In the second state, SM, the 2 most significant bits are evaluated. The MSBs-neuron is charged with $I_0/4$, while the LSBs neuron is charged with $I_{in}$. Since $0 \leq I_{in}<I_0$, the LSBs neuron may fire up to 3 $SP_L$ spikes. These spikes are upcounted in a 2-bit MSBs counter initialized to 00. If more than 3 spikes are fired, an overranging error occurs and is interpreted as such; alternatively, the regular and overflow spikes may be counted in a counter that is capable of handling more than 2 bits. In the illustrative implementation, only for a 2-bit counter is provided.

3. In the third state, SL, the 2 least significant bits and error correction are performed via a downcounting multiply-by-8 operation. This operation has already been described in detail above.

4. In the fourth state, SW, we feed any overflows from the LSB evaluation to the MSB counter. As Table 2 shows, overflows happen if no spikes are fired in the LSB evaluation stage. This fourth state is also a bookkeeping state and is used to write the answer to registers clocked by Phi. When Phi goes high, we leave this state for the first state, SD, to begin the process anew.

Figure 10:
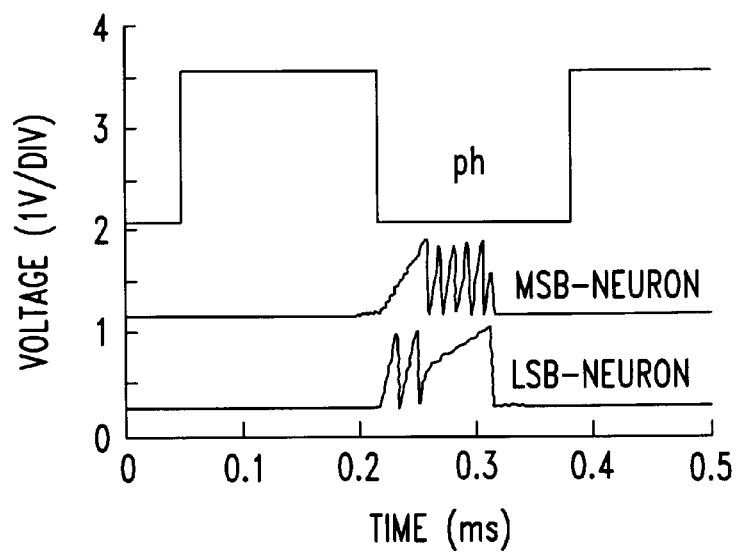
FIG. 10 shows neuronal state variables in an overrange-subrange 2-step A/D converter in accordance with illustrative embodiments of the present invention.

FIG. 10 shows the clock Phi, MSBs-neuron, and LSBs-neuron state variables during a full cycle of conversion. In this example, during SM, the LSBs neuron fires 2 spikes while the MSBs neuron fires 1 spike. Thus, the most significant bits are evaluated as 10. During SL, the residue left on the LSBs neuron is evaluated by the MSBs neuron to be 10: From Table 2, the 4 spikes fired by the MSBs neuron during SL correspond to a rounded value of 2. Thus, the answer to this conversion in binary is that $I_{in}=(I_0/4)\times(10.10)$, or, more simply $I_{in}\_2.5(I_0/4)$.

Figure 11:
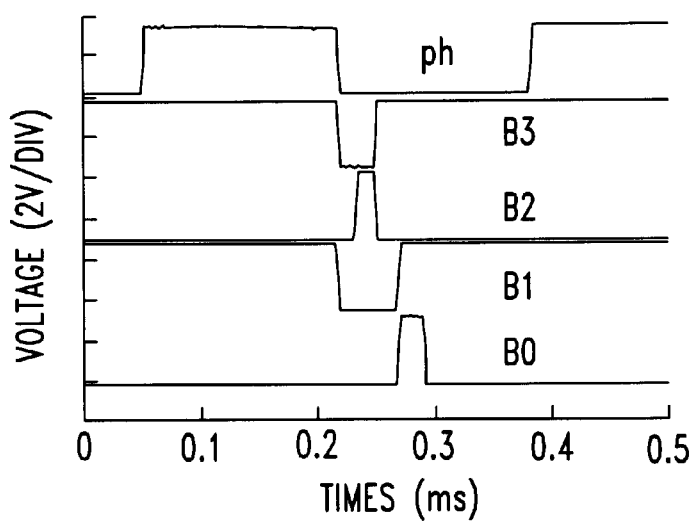
FIG. 11 shows illustrative counter state variables in an overrange-subrange 2-step A/D converter in accordance with illustrative embodiments of the present invention.
Figure 12:
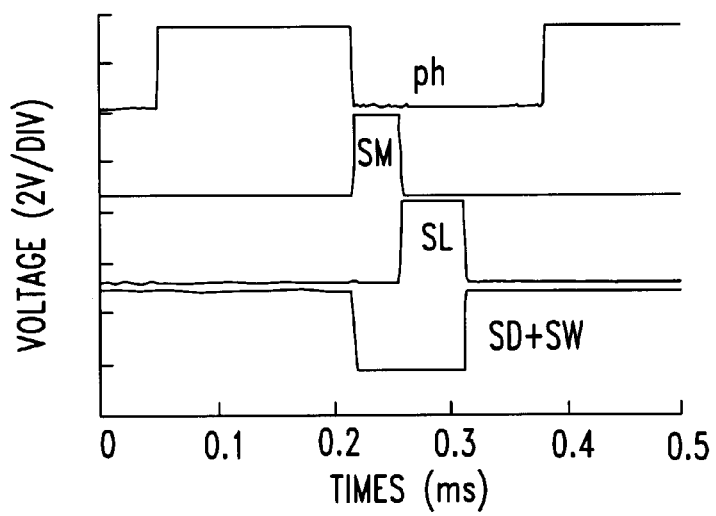
FIG. 12 shows illustrative spike-triggered FSM state variables in an overrange-subrange 2-step A/D converter in accordance with illustrative embodiments of the present invention.

FIG. 11 shows that the $B_3B_2B_1B_0$ state of the MSBs and LSBs counter conglomerate is indeed 1010 at the end of the conversion. FIG. 12 shows the SM, SL, SW and SD logical state variables during the conversion; the logical combination (SW OR SD) is also shown.

Figure 13:
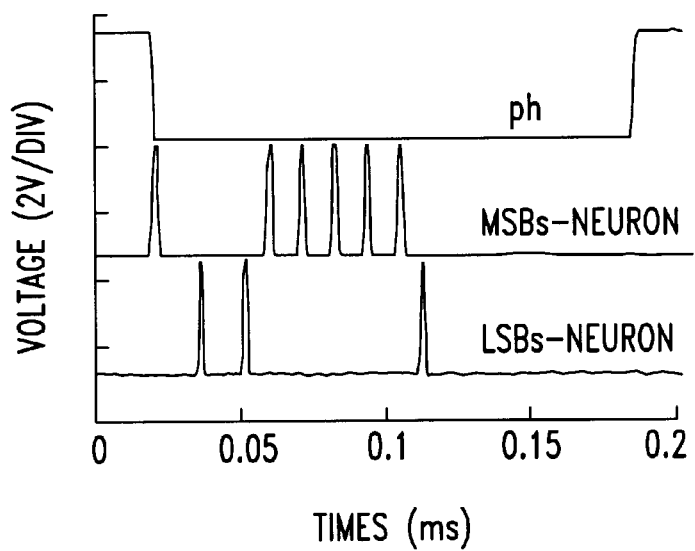
FIG. 13 shows spikes illustratively fired during operation of an overrange-subrange 2-step A/D converter in accordance with illustrative embodiments of the present invention.

FIG. 13 shows the spikes $Sp_M$ and $Sp_L$ fired by the MSBs and LSBs neurons during conversion. The very first spike fired by the MSBs-neuron causes the quick transition out of SD and into SM. During SM, the LSBs neuron fires 2 spikes. The second spike on the MSBs neuron causes a transition out of SM and into SL. The remaining four spikes on the MSBs-neuron are fired during SL. The SL state concludes when the LSBs-neuron fires its timing spike, the last spike of the LSBs neuron in FIG. 13.

The data displayed in FIGS. 10–13 are illustrative of a D/A converter as described with reference to FIG. 9 with a value of $I_0 \approx 64$ nA, with a neuronal charging capacitance of 0.5pF, a threshold voltage of spike firing of $V_{DD}/2 = 1.6$ V, and a pulse width of approximately 10 $\mu$s.

Numerous and varied adaptations and modifications of the described embodiments of the present invention, all within the scope and spirit of the invention and the attached claims, will be clear to those skilled in the art in light of the present inventive teachings.

What is claimed is:

1. A downcounting circuit comprising first and second neurons, each said neuron characterized by an analog state variable, said first neuron having an initial state characterized by an unknown angular displacement $-\theta$, said second neuron having an initial state characterized by a known angular displacement, means for applying currents in the proportion 1: R to said first and second neurons, respectively, where R is an integer, said currents being applied until said first neuron generates a first spiking output, whereby, an approximation to the initial state of said first neuron is given by $n\pi/2$, where n is the number of spiking outputs from said second neuron.

2. The circuit of claim 1, wherein the state of said second neuron at the time of said first spiking output is a residue reflecting the error in said approximation.

3. The circuit of claim 2 further comprising refining means for more exactly evaluating said residue, thereby gaining a closer approximation to said initial state.

4. The circuit of claim 3 wherein said refining means comprises third and fourth neurons wherein an initial state of said third neuron is characterized by said residue.

5. The circuit of claim 4 wherein said third neuron is identically the same neuron as said first neuron.

6. The circuit of claim 1 wherein said currents applied to said first and second neurons are $I_0/4$ and $I_0$, respectively.

7. The circuit of claim 1 wherein said known angular displacement is 0.

8. The circuit of claim 1 wherein R =4.

9. The circuit of claim 1 further comprising means for adjusting said currents applied to said first and second neurons after said first spiking output.

10. An upcounting circuit comprising first and second neurons, each said neuron characterized by an analog state variable, said first neuron having an initial state characterized by an unknown angular displacement $\theta$ said second neuron having an initial state characterized by a known angular displacement, means for applying currents in the proportion 1:R to said first and second neurons, respectively, where R is an integer, said currents being applied until said first neuron generates a first spiking output, whereby, an approximation to the initial state of said first neuron is given by (3−n)2, where n is the number of spiking outputs from said second neuron.

11. The circuit of claim 10, wherein the state of said second neuron at the time of said first spiking output is a residue reflecting the error in said approximation.

12. The circuit of claim 11 further comprising refining means for more exactly evaluating said residue, thereby gaining a closer approximation to said initial state.

13. The circuit of claim 11 wherein said refining means comprises third and fourth neurons wherein an initial state of said third neuron is characterized by said residue.

14. The circuit of claim 13 wherein said third neuron is identically the same neuron as said first neuron.

15. The circuit of claim 10 wherein said known angular displacement is 0.

16. The circuit of claim 10 wherein R=4.

17. The circuit of claim 10 further comprising means for adjusting said currents applied to said first and second neurons after said first spiking output.

18. In a system having at least one neuron pair, said neuron pair comprising first and second neurons, each said neuron characterized by an analog state variable, said first neuron having an initial state characterized by an unknown angular displacement $\theta$, said second neuron having an initial state characterized by a known angular displacement, an analog-to-digital conversion method comprising a. applying currents of $I_0/R$ and $I_0$ to respective first and second neurons of a first neuron pair, where R is an integer, said currents being applied until said first neuron of said first neuron pair generates a first spiking output, b. counting the number of spikes generated by said second neuron while said current is applied to said second neuron, c. setting said state variable for a neuron of a neuron pair to a value based on the state of said second neuron at the time of said first spiking output, repeating steps a–c while retaining the count of spikes at each repetition, whereby, an approximation to the initial state of said first neuron is given by a weighted sum of said spiking outputs.

19. The method of claim 18 wherein said analog state variable reflects an electric charge stored in an analog storage device.

20. The method of claim 19 wherein changes in said analog state variables reflect an accumulation of charge resulting from said respective applied currents over a time identified by said first spiking outputs.

21. The method of claim 18 wherein said step (c) further comprises altering said charging currents to said neurons in at least one neuron pair.

* * * * *